(12) United States Patent
Thain et al.

(10) Patent No.: US 9,991,603 B2
(45) Date of Patent: Jun. 5, 2018

(54) DEVICE, INTENDED TO BE FIXED ON A WALL, FOR ABSORBING ELECTROMAGNETIC WAVES

(71) Applicant: Airbus Operations (SAS), Toulouse (FR)

(72) Inventors: Andrew Thain, L'Isle Jourdain (FR); Anass Jaber, Toulouse (FR); Alexandre Herve, Toulouse (FR)

(73) Assignee: Airbus Operations (SAS), Toulouse (FR)

( * ) Notice: Subject to any disclaimer, the term of this patent is extended or adjusted under 35 U.S.C. 154(b) by 103 days.

(21) Appl. No.: 15/142,359

(22) Filed: Apr. 29, 2016

(65) Prior Publication Data

US 2016/0322711 A1 Nov. 3, 2016

(30) Foreign Application Priority Data

Apr. 30, 2015 (FR) ...................................... 15 53909

(51) Int. Cl.
*E04B 1/92* (2006.01)
*H05K 9/00* (2006.01)
*H01Q 17/00* (2006.01)

(52) U.S. Cl.
CPC ............... *H01Q 17/00* (2013.01); *E04B 1/92* (2013.01); *H05K 9/0003* (2013.01); *E04B 2001/925* (2013.01)

(58) Field of Classification Search
CPC .... E04B 1/92; E04B 2001/925; H05K 9/0003
See application file for complete search history.

(56) References Cited

U.S. PATENT DOCUMENTS

| 2,961,478 A | * | 11/1960 | Burns | .................. H05K 9/0001 174/363 |
| 3,605,365 A | * | 9/1971 | Hastings | .................. E04L 31/35 264/45.3 |
| 3,783,174 A | * | 1/1974 | Lindgren | ............. H05K 9/0003 174/373 |

(Continued)

FOREIGN PATENT DOCUMENTS

DE 3321604 A * 12/1984
EP 1860733 11/2007

(Continued)

OTHER PUBLICATIONS

French Search Report, dated Feb. 15, 2016, priority document.

(Continued)

*Primary Examiner* — Charles A Fox
*Assistant Examiner* — Charissa Ahmad
(74) *Attorney, Agent, or Firm* — Greer, Burns & Crain, Ltd.

(57) ABSTRACT

A device, intended to be fixed on a wall, for absorbing electromagnetic waves. The absorption device comprises a metal plate intended to be fixed on the wall, a dielectric panel at a distance from the metal plate and delimiting, with the metal plate, a volume between the metal plate and the dielectric panel, an array of resistive dipoles, all the resistive dipoles being fixed on the same face of the dielectric panel, and each comprising two metal platelets at a distance from one another and a resistor arranged between the opposing edges of two neighboring metal platelets.

16 Claims, 2 Drawing Sheets

(56) References Cited

U.S. PATENT DOCUMENTS

| | | | | |
|---|---|---|---|---|
| 4,118,704 A * | 10/1978 | Ishino | H01Q 17/008 | 342/4 |
| 4,479,339 A * | 10/1984 | Kroh | E04D 13/1637 | 52/144 |
| 4,507,520 A * | 3/1985 | Lindgren | H05K 9/0001 | 174/368 |
| 4,755,630 A * | 7/1988 | Smith | H05K 9/0001 | 174/366 |
| 4,794,206 A * | 12/1988 | Weinstein | H05K 9/0001 | 16/354 |
| 4,929,802 A * | 5/1990 | Schaepers | H05K 9/0016 | 174/368 |
| 5,003,743 A * | 4/1991 | Bifano | E04F 13/06 | 52/288.1 |
| 5,017,736 A * | 5/1991 | Yarger | H05K 9/0001 | 174/364 |
| 5,043,529 A * | 8/1991 | Vanesky | A61B 5/04005 | 174/363 |
| 5,081,455 A * | 1/1992 | Inui | H01Q 17/002 | 342/1 |
| 5,214,432 A * | 5/1993 | Kasevich | H01Q 17/00 | 342/3 |
| 5,286,318 A * | 2/1994 | Sims | E04D 11/02 | 156/71 |
| 5,353,029 A * | 10/1994 | Johnston | H01Q 17/00 | 342/1 |
| 5,537,116 A * | 7/1996 | Ishino | H01Q 17/00 | 342/1 |
| 5,569,878 A * | 10/1996 | Zielinski | H05K 9/0001 | 174/364 |
| 5,709,058 A * | 1/1998 | Shaw | E04B 2/707 | 52/282.1 |
| 5,937,600 A * | 8/1999 | Larson | E04L 31/762 | 52/302.6 |
| 6,037,046 A * | 3/2000 | Joshi | E04B 1/92 | 174/386 |
| 6,165,601 A * | 12/2000 | Noda | H01Q 17/00 | 342/1 |
| 6,282,848 B1 * | 9/2001 | Schlapfer | H05K 9/0001 | 52/265 |
| 7,345,616 B2 * | 3/2008 | Williams | F41H 3/00 | 250/505.1 |
| 7,385,147 B2 * | 6/2008 | Garmong | H05K 9/0001 | 174/364 |
| 7,864,095 B2 * | 1/2011 | Masuda | H01Q 1/38 | 342/1 |
| 8,106,810 B2 * | 1/2012 | Holly | A61F 9/022 | 342/1 |
| 9,200,455 B2 * | 12/2015 | Preston | E04F 13/06 | |
| 9,260,865 B2 * | 2/2016 | Rothwell | E04C 2/205 | |
| 9,507,063 B2 * | 11/2016 | Thain | H05K 9/0001 | |
| 9,755,316 B2 * | 9/2017 | Thain | H01Q 15/0006 | |
| 2013/0091797 A1 * | 4/2013 | Holt | E04L 31/7629 | 52/512 |

FOREIGN PATENT DOCUMENTS

| | | | | |
|---|---|---|---|---|
| GB | 2251338 A * | 7/1992 | | H01Q 17/00 |
| JP | 2002076677 A * | 3/2002 | | |

OTHER PUBLICATIONS

"Broadband Dual-Polarization Microwave Absorber Based on Broadside-Folded Dipole Array With Triangle-Lattice Cells", Chang Yumei et al, Jun. 16, 2014.

"Theoretical investigation on wideband folded dipole microwave absorber using filtering concept", Yumei Chang et al., Dec. 4, 2012.

\* cited by examiner

DEVICE, INTENDED TO BE FIXED ON A WALL, FOR ABSORBING ELECTROMAGNETIC WAVES

CROSS-REFERENCES TO RELATED APPLICATIONS

This application claims the benefit of the French patent application No. 1553909 filed on Apr. 30, 2015, the entire disclosures of which are incorporated herein by way of reference.

BACKGROUND OF THE INVENTION

The invention relates to a device for absorbing electromagnetic waves, particularly in the VHF and UHF ranges, which is intended to be fitted to a wall, such as an exterior wall of a building, as well as to a building having at least one wall equipped with such an absorption device.

The invention relates to the general field of the absorption of electromagnetic waves, in particular radio waves, and more particularly to that of preventing the effects of radio waves reflected by structures such as walls of buildings over the space surrounding such structures. The invention applies more particularly in the vicinity of airports, in order to prevent perturbations from interfering with the radio measurement systems.

Owing to the presence of numerous radio sources, in particular ILS ("Instrument Landing System") antennas, the problem of stray reflections by buildings is a significant problem, the resolution of which generally involves setting up an installation plan including regions, in particular regions relatively close to the runways, in which it is prohibited to place any structure even of small size. However, in view particularly of the urban concentration and the desire to place airports at relatively short distances from urban areas, it is becoming more and more necessary to maximize the occupancy of airports in terms of area on the ground. Consequently, finding a solution to the problems of stray reflections of radio signals in sensitive directions seems more relevant than ever.

Current solutions are based on installing screens in the form of diffraction devices. These screens consist of elements arranged periodically on the wall of the building. Such screens, like those described in the document FR-A-2 983 577, make it possible to reflect the electromagnetic waves without absorbing them. In order to absorb the electromagnetic waves, it is currently possible to provide absorbent foams, but these foams are thick and are not suitable for outside use.

SUMMARY OF THE INVENTION

It is an object of the present invention to provide a device for absorbing electromagnetic waves, which improves the prior art and in particular makes it possible to obtain sufficient absorption of electromagnetic waves, and which is furthermore simple and easy to use.

To this end, a device intended to be fixed on a wall, for absorbing electromagnetic waves, is provided, the absorption device comprising:
  a metal plate intended to be fixed on the wall,
  a dielectric panel at a distance from the metal plate and delimiting, with the metal plate, a volume between the metal plate and the dielectric panel,
  an array of resistive dipoles, all the resistive dipoles being fixed on the same face of the dielectric panel, and each comprising two metal platelets at a distance from one another and a resistor arranged between the opposing edges of two neighboring metal platelets.

Such an absorption device makes it possible to obtain good absorption of electromagnetic waves.

Advantageously, the resistor is a discrete component or a resistive layer.

Advantageously, the volume is filled with a dielectric material.

Advantageously, the absorption device comprises metal walls electrically connected to the metal plate and extending from the metal plate in the direction of the dielectric panel.

Advantageously, the metal walls extend over a length of between 85% and 115% of the distance between the metal plate and the dielectric panel.

Advantageously, the absorption device comprises struts and a protective plate which are made of dielectric materials, each strut being fixed on the metal plate and having a free end which extends beyond the dielectric panel, the protective plate being fixed to the free end in order to protect the absorption device from rain.

The invention also provides a building having at least one wall and an absorption device according to one of the variants above, wherein the metal plate is fixed on the wall.

BRIEF DESCRIPTION OF THE DRAWINGS

The above-mentioned characteristics of the invention, as well as others, will become clearer on reading the following description of an exemplary embodiment, said description being given with reference to the appended drawings, in which.

DETAILED DESCRIPTION OF THE PREFERRED EMBODIMENTS

Figure 1:
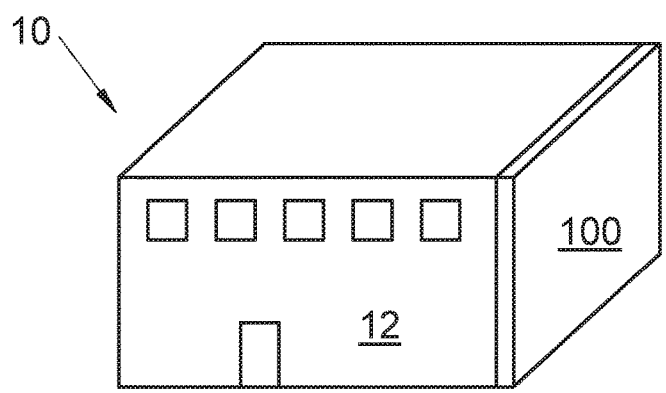
FIG. 1 is a perspective view of a building having a device according to the invention for absorbing electromagnetic waves.

FIG. 1 shows a building 10 which has exterior walls 12, of which in this case one is covered with a device 100 according to the invention for absorbing electromagnetic waves.

Figure 2:
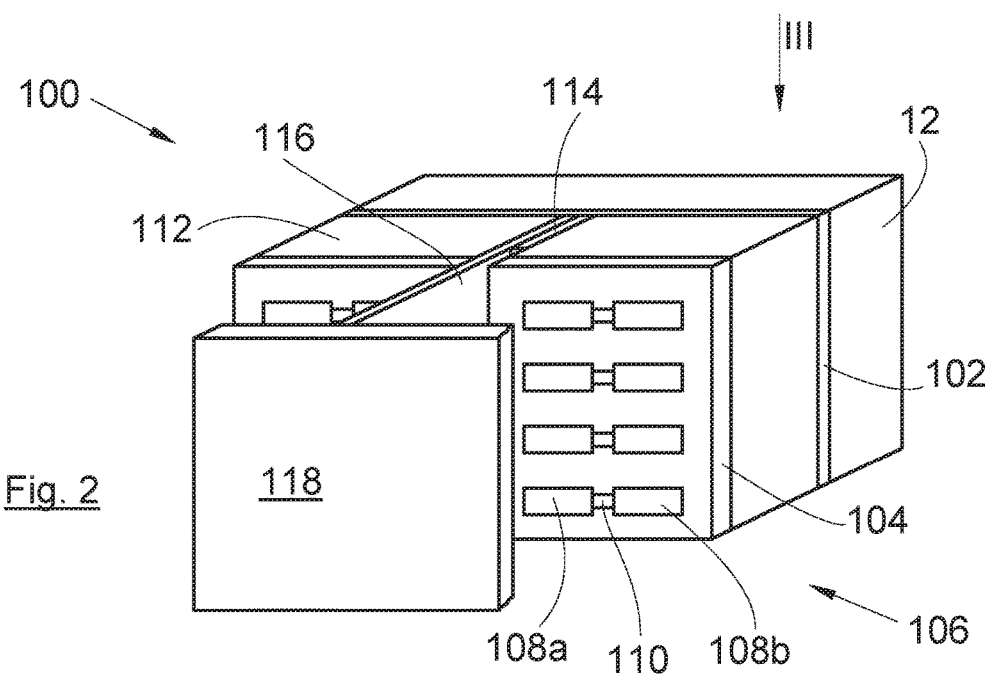
FIG. 2 is a perspective view of a device according to the invention for absorbing electromagnetic waves.
Figure 3:
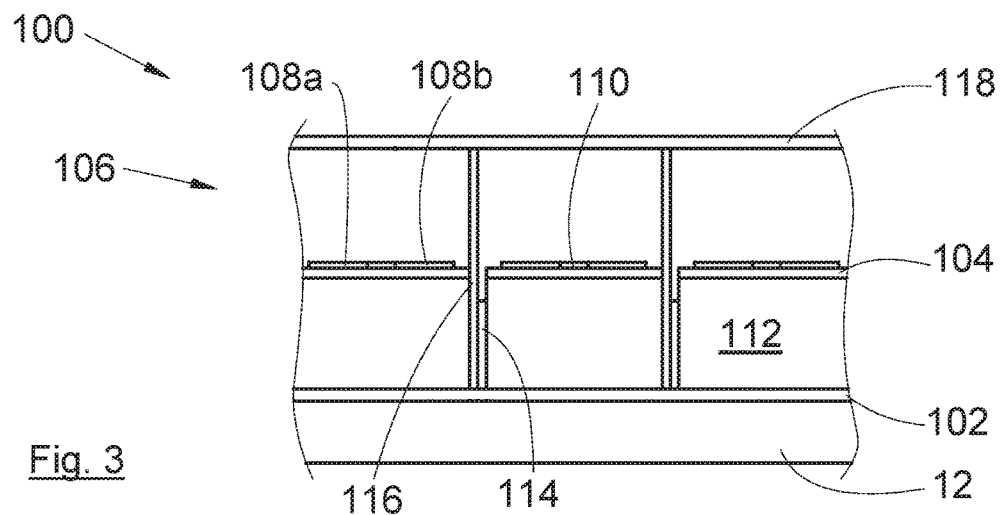
FIG. 3 is a view of the absorption device of FIG. 2 along the arrow III.

FIG. 2 and FIG. 3 show the absorption device 100, which is fixed on an exterior wall 12.

The absorption device 100 comprises:
  a metal plate 102, which is intended to be fixed on the exterior wall 12 and constitutes the mass of the absorption device 100,
  a dielectric panel 104 at a distance from the metal plate 102 and delimiting, with the metal plate 102, a volume 112 between the metal plate 102 and the dielectric panel 104,
  an array of resistive dipoles 106, all the resistive dipoles 106 being fixed on the same face of the dielectric panel 104.

The metal plate 102 is preferably made of aluminum, which makes it possible to reduce the weight of the absorption device 100. The metal plate 102 is, for example, fixed to the exterior wall 12 by screwing.

The dielectric panel 104 is, for example, made of polycarbonate.

Each resistive dipole 106 comprises two metal platelets 108*a-b* at a distance from one another and a resistor 110 arranged between the opposing edges of two neighboring metal platelets 108*a-b*.

Such a geometry generates a high input impedance and a low input reactance variation.

The resistor 110 may be a discrete component or a resistive layer. The value of the resistor 110 is equal or close to the real component of the input impedance of the dipole comprising the two metal platelets 108*a-b*.

The proximity of the resistive dipoles 106 to one another makes it possible to cancel out the reactive component and to increase the resistive component of the input impedance of the resistive dipoles 106.

The array of resistive dipoles 106 comprises a set of rows which are parallel to one another, and columns which are parallel to one another and perpendicular to the rows, a resistive dipole 106 being placed at each row/column intersection.

In the embodiment of the invention as presented here, the absorption device 100 comprises struts 116 which are fixed on the metal plate 102 and pass through the volume 112. The dielectric panel 104 is in this case fixed on the struts 116 and is parallel to the metal plate 102. The struts 116 are made of a dielectric material, for example polycarbonate or PVC.

In the embodiment of the invention as proposed here, all the resistive dipoles 106 are fixed on that face of the dielectric panel 104 which is turned away from the metal plate 102, but in another embodiment all the resistive dipoles 106 could be fixed on that face of the dielectric panel 104 which is turned toward the metal plate 102.

The volume 112 between the metal plate 102 and the dielectric panel 104 may be filled with air or a dielectric material, for example extruded polystyrene.

In one particular embodiment, the dielectric panel 104 is placed at 0.15 m from the metal plate 102, which makes it possible to produce a resonant frequency having a less frequency-dependent reactance and a higher resistance than if the dielectric panel 104 is placed at a short distance.

In order to improve the capacitive coupling between two neighboring resistive dipoles 106, a plurality of metal walls 114 are arranged in the volume 112. These metal walls 114 extend perpendicularly to the metal plate 102 and are electrically connected thereto. The metal walls 114 extend from the metal plate 102 in the direction of the dielectric panel 104. The metal walls 114 also make it possible to increase the angular response of the signal reduction, as well as to increase the passband.

Preferably, the metal walls 114 extend from the metal plate 102 over a length which may vary from 85% to 115% of the thickness of the volume 112, that is to say of the distance between the metal plate 102 and the dielectric panel 104.

In order to ensure protection against inclement weather, and in particular rainwater, the absorption device 100 also comprises a protective plate 118, and the struts 116 are extended beyond the dielectric panel 104 by a free end on which the protective plate 118 is fixed. The protective plate 118 is made of a dielectric material, for example polycarbonate or PVC.

Such an absorption device 100 allows good absorption of electromagnetic waves, particularly in the UHF and VHF bands.

Figure 4:
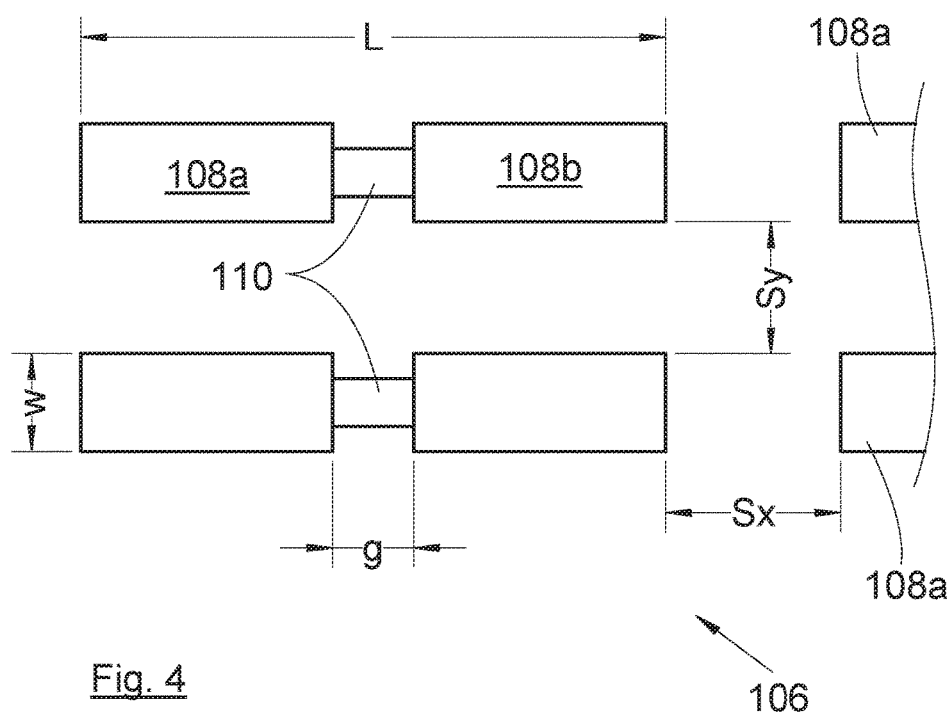
FIG. 4 shows an enlargement of a detail of the absorption device according to the invention.

FIG. 4 shows an enlargement of a set of resistive dipoles 106 according to one particular embodiment. In this particular embodiment, each resistive dipole 106 comprises two rectangular metal platelets 108*a-b* which are separated by a distance 'g'.

Each metal platelet 108*a-b* has a width 'w'.

The total length of the resistive dipole 106 is L. The length of each metal platelet 108*a-b* is therefore $$\frac{L-g}{2}.$$

The resistor 110 has a resistance R.

The distance between two neighboring resistive dipoles 106 is Sx parallel to the total length L and Sy perpendicular to the total length L.

The various dimensions defined in this way are calculated by numerical simulation by using a semianalytical formula for the input impedance of a resistive dipole in an infinite array of resistive dipoles which is located above a ground plane comprising the metal plate 102, as is described in the article "Scan impedance for an infinite dipole array: accurate theoretical model compared to numerical software" by Makarov, Puzella and Lyer published on 6 Dec. 2008 in IEEE Antennas and Propagation Magazine, Vol 50, No. 6.

In the case of a frequency of 108.55 MHz at an angle of incidence of 53°, 90% absorption is obtained with the following values:

L=1.2 m; g=0.01 m; w=0.025 m; Sx=0.15 m; Sy=0.7 m and R=33 ohms.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An absorption device, intended to be fixed on a wall, for absorbing electromagnetic waves, the absorption device comprising:
    a metal plate intended to be fixed on the wall,
    a dielectric panel at a distance from the metal plate and delimiting, with the metal plate, a volume between the metal plate and the dielectric panel, and
    a plurality of resistive dipoles forming an array, all the resistive dipoles being fixed on the same face of the dielectric panel, and each comprising two metal platelets at a distance from one another and a resistor arranged between the opposing edges of two neighboring metal platelets, wherein the resistive dipoles are arranged in parallel rows and parallel columns perpendicular to the parallel rows, and wherein a resistive dipole is arranged at each intersection of the parallel rows and parallel columns, and wherein the two metal platelets of each resistive dipoles are arranged horizontally, wherein the absorption device comprises a plurality of metal walls electrically connected to the metal plate and extending from the metal plate in the direction of the dielectric panel, and wherein a metal wall from the plurality of metal walls is disposed between neighboring resistive dipoles in the parallel rows.

2. The absorption device according to claim 1, wherein the resistor is a discrete component.

3. The absorption device according to claim 1, wherein the resistor is a resistive layer.

4. The absorption device according to claim 1, wherein the volume is filled with a dielectric material.

5. The absorption device according to claim 4, wherein the metal walls extend over a length of between 85% and 115% of the distance between the metal plate and the dielectric panel.

6. The absorption device according to claim 1, further comprising struts and a protective plate which are made of dielectric materials, each strut being fixed on the metal plate and having a free end which extends beyond the dielectric panel, the protective plate being fixed to the free end in order to protect the absorption device from rain.

7. The absorption device according to claim 1, wherein a metal wall from the plurality of metal walls is disposed between all neighboring resistive dipoles in the parallel rows.

8. The absorption device according to claim 1, further comprising a strut adjacent to one of the metal walls, the struct being fixed to the metal plate and having a free end which extends beyond the dielectric panel and is coupled to a protective plate extending parallel to the metal plate.

9. A building comprising:
at least one wall and
an absorption device comprising:
  a metal plate,
  a dielectric panel at a distance from the metal plate and delimiting, with the metal plate, a volume between the metal plate and the dielectric panel, and
  a plurality of resistive dipoles forming an array, all the resistive dipoles being fixed on the same face of the dielectric panel, and each comprising two metal platelets at a distance from one another and a resistor arranged between the opposing edges of two neighboring metal platelets, wherein the resistive dipoles are arranged in parallel rows and parallel columns perpendicular to the parallel rows, and wherein a resistive dipole is arranged at each intersection of the parallel rows and parallel columns, and wherein the two metal platelets of each resistive dipoles are arranged horizontally, wherein the absorption device comprises a plurality of metal walls electrically connected to the metal plate and extending from the metal plate in the direction of the dielectric panel, wherein a metal wall from the plurality of metal walls is disposed between neighboring resistive dipoles in the parallel rows, and wherein the metal plate is fixed on the building wall.

10. The building according to claim 9, wherein the resistor is a discrete component.

11. The building according to claim 9, wherein the resistor is a resistive layer.

12. The building according to claim 9, wherein the volume is filled with a dielectric material.

13. The building according to claim 12, wherein the metal walls extend over a length of between 85% and 115% of the distance between the metal plate and the dielectric panel.

14. The building according to claim 9, further comprising struts and a protective plate which are made of dielectric materials, each strut being fixed on the metal plate and having a free end which extends beyond the dielectric panel, the protective plate being fixed to the free end in order to protect the absorption device from rain.

15. The building of claim 9, wherein a metal wall from the plurality of metal walls is disposed between all neighboring resistive dipoles in the parallel rows.

16. The building of claim 9, further comprising a strut adjacent to one of the metal walls, the struct being fixed to the metal plate and having a free end which extends beyond the dielectric panel and is coupled to a protective plate extending parallel to the metal plate.

* * * * *